(12) United States Patent
Bekyarova et al.

(10) Patent No.: US 10,908,025 B2
(45) Date of Patent: Feb. 2, 2021

(54) PATTERNED FOCAL PLANE ARRAYS OF CARBON NANOTUBE THIN FILM BOLOMETERS WITH HIGH TEMPERATURE COEFFICIENT OF RESISTANCE AND IMPROVED DETECTIVITY FOR INFRARED IMAGING

(71) Applicant: Carbon Solutions, Inc., Riverside, CA (US)

(72) Inventors: Elena Borisova Bekyarova, Riverside, CA (US); Mikhail Efimovich Itkis, Riverside, CA (US); Ramesh Palanisamy, Riverside, CA (US); Robert Cort Haddon, Riverside, CA (US)

(73) Assignee: CARBON SOLUTIONS, INC., Riverside, CA (US)

( * ) Notice: Subject to any disclaimer, the term of this patent is extended or adjusted under 35 U.S.C. 154(b) by 158 days.

(21) Appl. No.: 15/834,694

(22) Filed: Dec. 7, 2017

(65) Prior Publication Data

US 2018/0156668 A1 Jun. 7, 2018

Related U.S. Application Data

(60) Provisional application No. 62/431,070, filed on Dec. 7, 2016.

(51) Int. Cl.
| | |
|---|---|
| G01J 5/20 | (2006.01) |
| H01L 37/02 | (2006.01) |
| H01L 27/16 | (2006.01) |
| G01J 5/02 | (2006.01) |
| G01J 5/00 | (2006.01) |

(52) U.S. Cl.
CPC .............. *G01J 5/20* (2013.01); *G01J 5/023* (2013.01); *H01L 27/16* (2013.01); *H01L 37/025* (2013.01); *G01J 2005/0077* (2013.01); *G01J 2005/204* (2013.01); *H01J 2201/30434* (2013.01);

(Continued)

(58) Field of Classification Search
CPC .... G01J 5/24; G01J 5/0809; G01J 5/20; G01J 5/023; G01J 2005/0077; G01J 2005/204; H01L 31/028; H01L 31/095; H01L 37/025; H01L 27/16; H01J 2201/30434; H01J 2329/0455; H01J 2201/30469
See application file for complete search history.

(56) References Cited

U.S. PATENT DOCUMENTS

| | | | |
|---|---|---|---|
| 6,919,730 | B2 | 7/2005 | Cole et al. |
| 7,268,350 | B1 | 9/2007 | Ouvrier-Buffet et al. |

(Continued)

FOREIGN PATENT DOCUMENTS

| | | |
|---|---|---|
| CN | 101561319 A | 10/2009 |
| CN | 101886261 A | 11/2010 |

OTHER PUBLICATIONS

Chem. Mater. 2001, 13, 11, 3823-3824 Publication Date: Oct. 24, 2001 https://doi.org/10.1021/cm0109903 (Year: 2001).*

(Continued)

*Primary Examiner* — Jarrett J Stark
(74) *Attorney, Agent, or Firm* — King & Schickli, PLLC

(57) ABSTRACT

A method of preparation of focal plane arrays of infrared bolometers includes processing carbon nanotubes to increase a temperature coefficient of resistance (TCR), followed by patterning to form focal plane arrays for infrared imaging.

15 Claims, 12 Drawing Sheets

(52) U.S. Cl.
CPC ............... *H01J 2201/30469* (2013.01); *H01J 2329/0455* (2013.01)

(56) References Cited

U.S. PATENT DOCUMENTS

| | | | |
|---|---|---|---|
| 7,611,628 B1* | 11/2009 | Hinds, III | B01D 69/141 210/500.27 |
| 7,723,684 B1* | 5/2010 | Haddon | G01J 5/02 250/338.1 |
| 8,110,883 B2 | 2/2012 | Ward et al. | |
| 8,455,828 B1 | 6/2013 | Egerton et al. | |
| 8,916,825 B1 | 12/2014 | Egerton et al. | |
| 8,926,933 B2 | 1/2015 | Zhang et al. | |
| 9,166,172 B2 | 10/2015 | Lu et al. | |
| 9,212,950 B2 | 12/2015 | Xu et al. | |
| 9,677,946 B1* | 6/2017 | Egerton | G01J 5/24 |
| 9,851,257 B1* | 12/2017 | Sood | G01J 5/10 |
| 9,945,720 B1* | 4/2018 | Egerton | G01J 1/44 |
| 10,297,700 B1* | 5/2019 | Egerton | H01L 31/028 |
| 2006/0166003 A1* | 7/2006 | Khabashesku | C01B 32/152 428/413 |
| 2007/0053825 A1* | 3/2007 | Li | D01F 11/14 423/460 |
| 2008/0170982 A1* | 7/2008 | Zhang | C01B 32/168 423/447.3 |
| 2008/0251723 A1* | 10/2008 | Ward | G01J 5/02 250/338.4 |
| 2009/0232724 A1* | 9/2009 | Afzali-Ardakani | B82Y 30/00 423/447.2 |
| 2009/0299082 A1* | 12/2009 | Baudot | C07D 303/04 549/513 |
| 2011/0017587 A1* | 1/2011 | Zhamu | B82Y 30/00 204/157.62 |
| 2012/0128878 A1* | 5/2012 | Li | B82Y 30/00 427/215 |
| 2013/0216469 A1 | 8/2013 | Sekino | |
| 2013/0256627 A1* | 10/2013 | Jain | G01J 5/023 257/9 |
| 2014/0105242 A1 | 4/2014 | Fernandes et al. | |
| 2018/0156668 A1* | 6/2018 | Bekyarova | G01J 5/20 |

OTHER PUBLICATIONS

Shang, et al., Design, Fabrication, and Characterization of a Polymer-Based MEMS Uncooled Infrared Focal Plane Array; Journal of Microelectromechanical Systems, vol. 24, No. 4, Aug. 2015.
Fernandes, et al., Carbon nanotube microbolometers on suspended silicon nitride via vertical fabrication procedure; Applied Physics Letters 104, 201115 (2014).
Narita, et al., A plastic-based bolometer array sensor using carbon nanotubes for low-cost infrared imaging devices; Sensors and Actuators A 195 (2013) 142-147.
Glamazda, et al., Achieving High Mid-IR Bolometric Responsivity for Anisotropic Composite Materials from Carbon Nanotubes and Polymers; Adv. Funct. Mater. 2012, 22, 2177-2186.
Lai, et al., Infrared imaging system using nanocarbon materials; Proc. of SPIE vol. 8373 837325-1, Apr. 23, 2012.
Gan, et al., Tuning the properties of graphene using a reversible gas-phase reaction, NPG Asia Materials (2012), 4; Nature Japan K.K.
Xie, et al., Room temperature ferromagnetism in partially hydrogenated epitaxial graphene, Applied Physics Letters 98, 193113 (2011).
Narita, et al., A plastic bolometer array using carbon nanotubes for low-cost infrared imaging devices; Oct. 2, 2011 Published in: Infrared, Millimeter and Terahertz Waves (IRMMW-THz), 2011 36th International Conference.
Xiao, et al., A polarized infrared thermal detector made from super-aligned multiwalled carbon nanotube films; Nanotechnology 22 (2011).
Sood, et al., Nanostructure Based EO/IR Focal Plane Array Development for Unattended Ground Sensor Applications; Apr. 28, 2011; Proc. of SPIE vol. 8046; Downloaded From: http://proceedings.spiedigitallibrary.org/.
Balog, et al., Bandgap opening in graphene induced by patterned hydrogen adsorption; Nature Materials, vol. 9, Apr. 2010; pp. 315-319.
Koechlin, et al., Opto-electrical characterization of infrared sensors based on carbon nanotube films; Comptes Rendus Physique 11 (2010) 405-410.
Cech, et al., Fabrication of freestanding SWCNT networks for fast microbolometric focal plane array sensor; Apr. 5, 2010 Micro- and Nanotechnology Sensors, Systems, and Applications II, Proc. of SPIE vol. 7679.
Sood, et al., Next Generation Nanostructure Based EO/IR Focal Plane Arrays for Unattended Ground Sensor Applications; Apr. 5, 2010; Proc. of SPIE vol. 7693 76930C-1; Downloaded From: http://proceedings.spiedigitallibrary.org.
Sood, et al., Design and Development of Carbon Nanostructure based Microbolometers for IR Imagers and Sensors; Apr. 5, 2010; Proc. of SPIE vol. 7679 76791Q-1.
Balog, et al., Atomic Hydrogen Adsorbate Structures on Graphene, J. Am. Chem. Soc. 2009, 131, pp. 8744-8745.
Bekyarova, et al., Chemical Modification of Epitaxial Graphene: Spontaneous Grafting of Aryl Groups; J. Am. Chem. Soc., 2009, 131 (4), pp. 1336-1337.
Guisinger, et al., Exposure of Epitaxial Graphene on SiC(0001) to Atomic Hydrogen, Nano Letters 2009, vol. 9, No. 4; pp. 1462-1466.
Nikitin, et al., Hydrogen Storage in Carbon Nanotubes through the Formation of Stable C-H Bonds, Nano Letters 2008, vol. 8, No. 1; pp. 162-167.
Zhang, et al., Fabrication and experimental testing of individual multi-walled carbon nanotube (CNT) based infrared sensors; Oct. 28, 2007;IEEE Sensors 2007 Conference.
Bahr, et al., Highly Functionalized Carbon Nanotubes Using in Situ Generated Diazonium Compounds, Chem. Mater. 2001, 13, pp. 3823-3824.
Bahr, et al., Functionalization of Carbon Nanotubes by Electrochemical Reduction of Aryl Diazonium Salts: A Bucky Paper Electrode, J. Am. Chem. Soc. 2001, 123, pp. 6536-6542.
Liu, et al., Reactions of Organic Monolayers on Carbon Surfaces Observed with Unenhanced Raman Spectroscopy, J Am. Chem. Soc. 1995,117, pp. 11254-11259.
Delamar, et al., Covalent Modification of Carbon Surfaces by Grafting of Functionalized Aryl Radicals Produced from Electrochemical Reduction of Diazonium Salts; J. Am. Chem. Soc. 1992, 114, pp. 5883-5884.
Giesbers, et al., Interface-Induced Room-Temperature Ferromagnetism in Hydrogenated Epitaxial Graphene, Physical Review Letters 111, 166101 (2013).
English Machine Translation of CN 101886261 A.
English Machine Translation of CN 101561319 A.

* cited by examiner

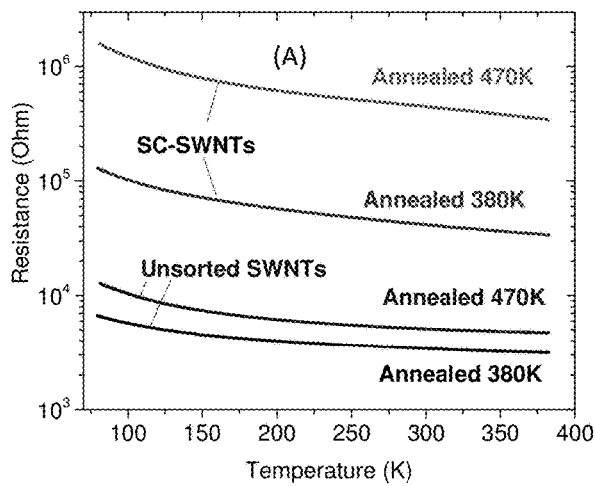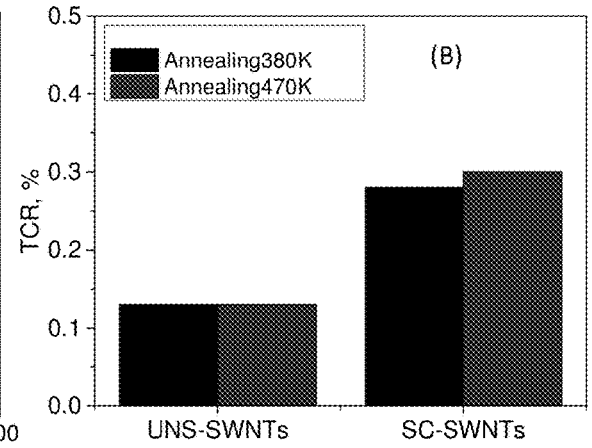
FIG. 3A　　　　　FIG. 3B
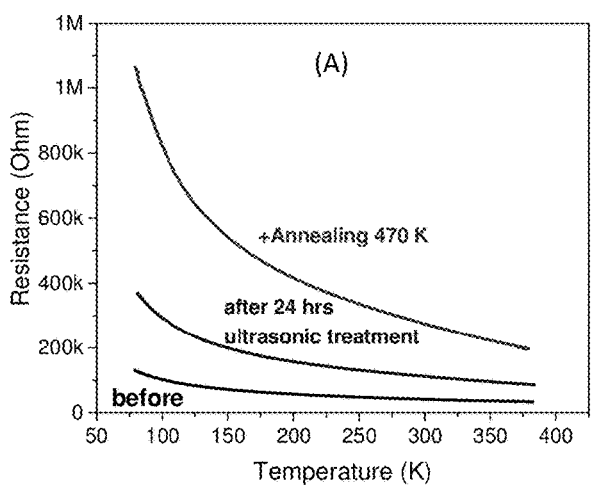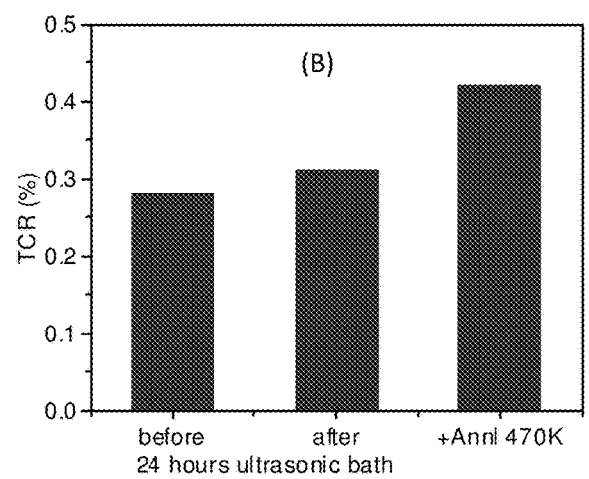
FIG. 4A　　　　　FIG. 4B

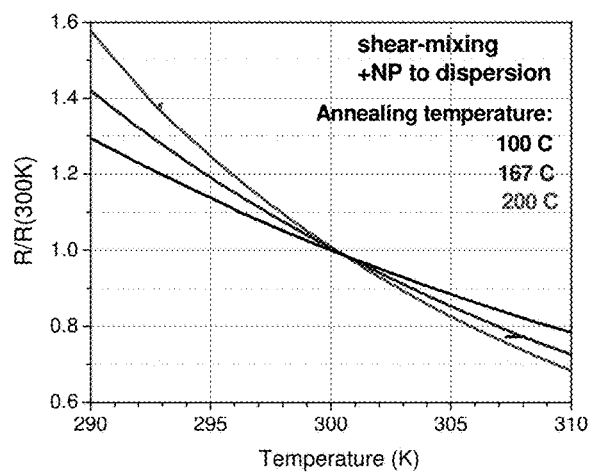
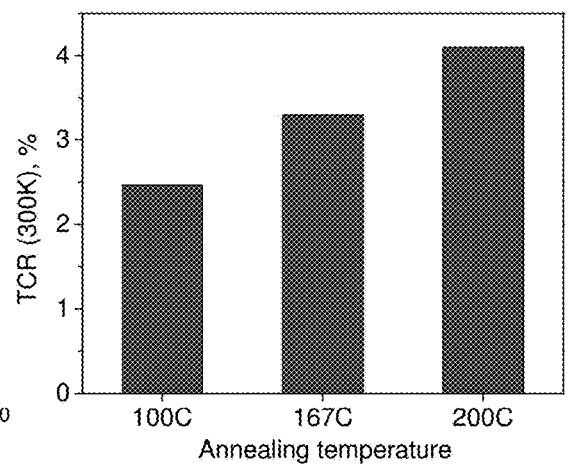
FIG. 13A        FIG. 13B
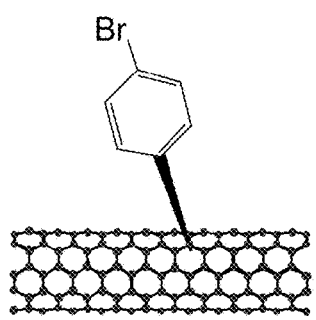
FIG. 14

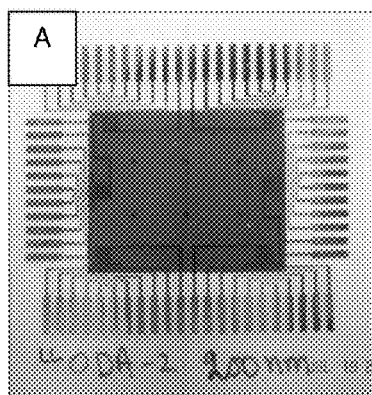 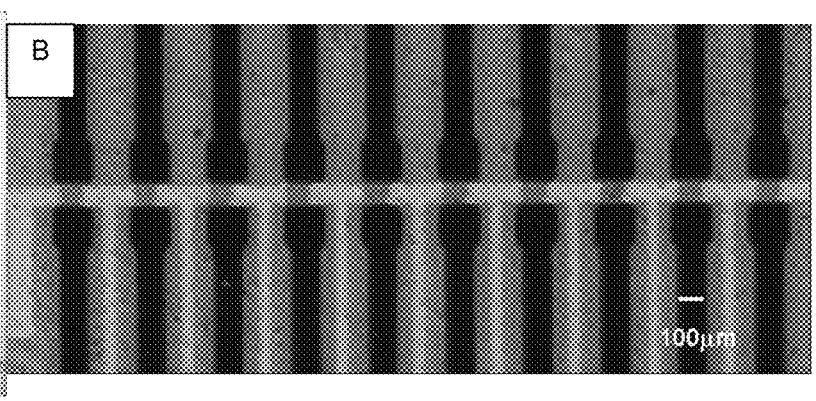
FIG. 21A  FIG. 21B
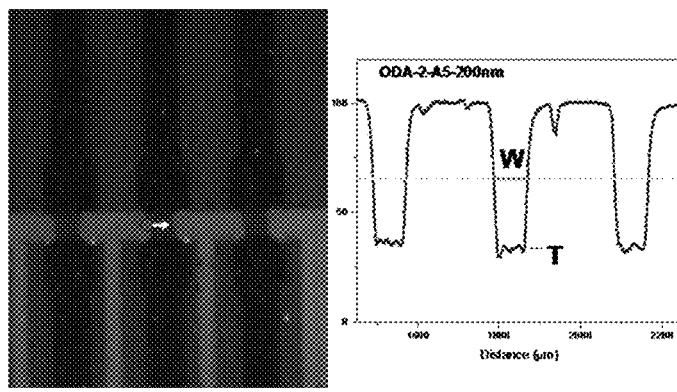
FIG. 22
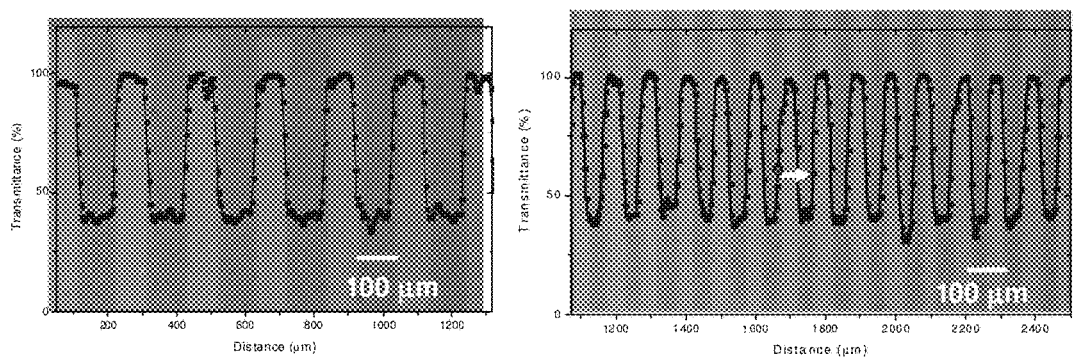
FIG. 23

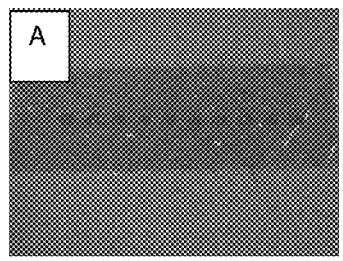
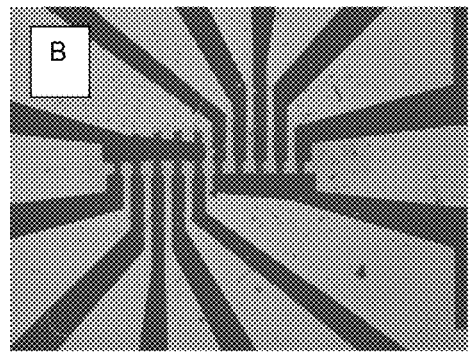
FIG. 24A          FIG. 24B
FIG. 25A
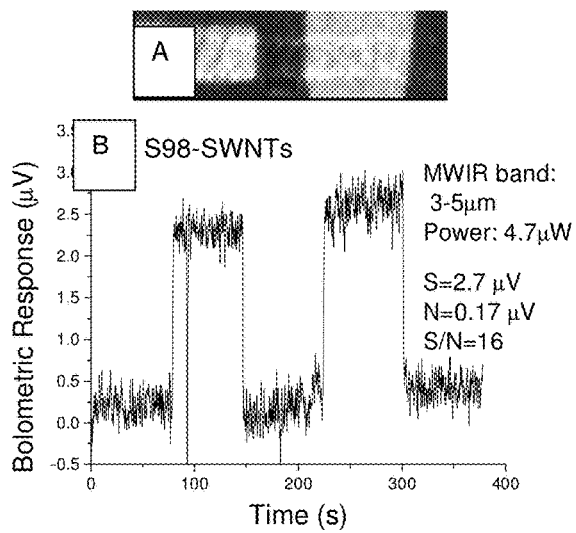
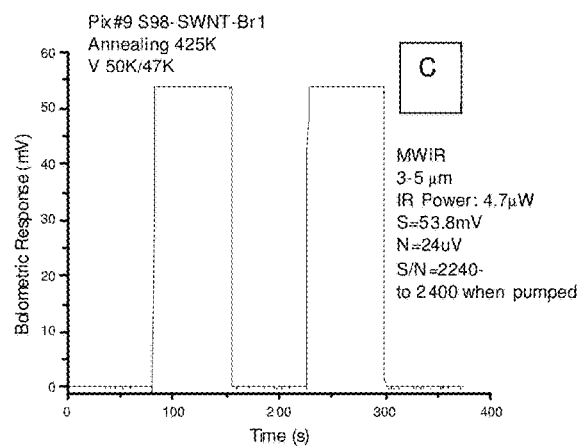
FIG. 25B          FIG. 25C

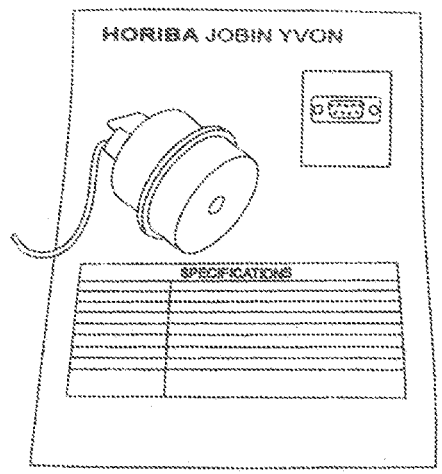
FIG. 26A
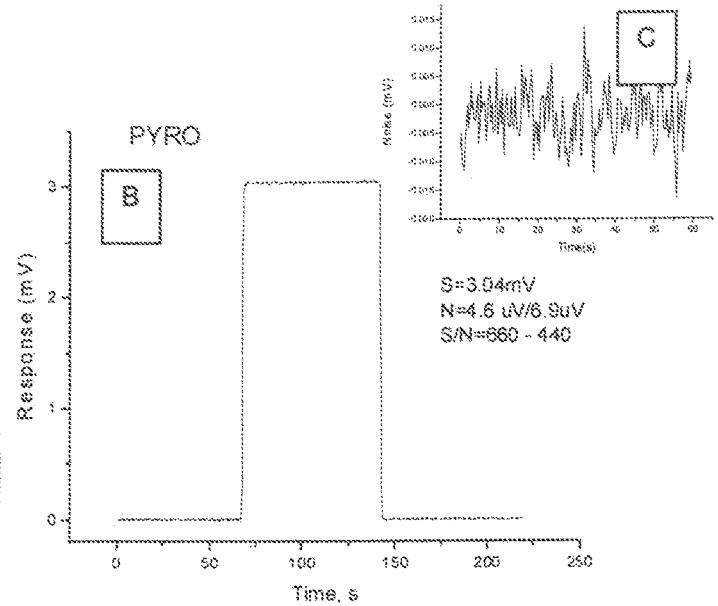
FIG. 26B
FIG. 26C
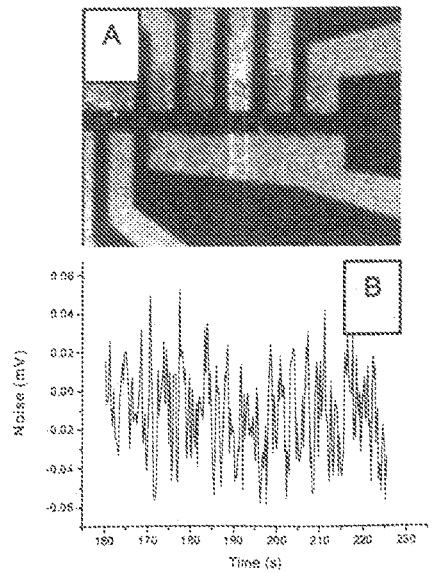
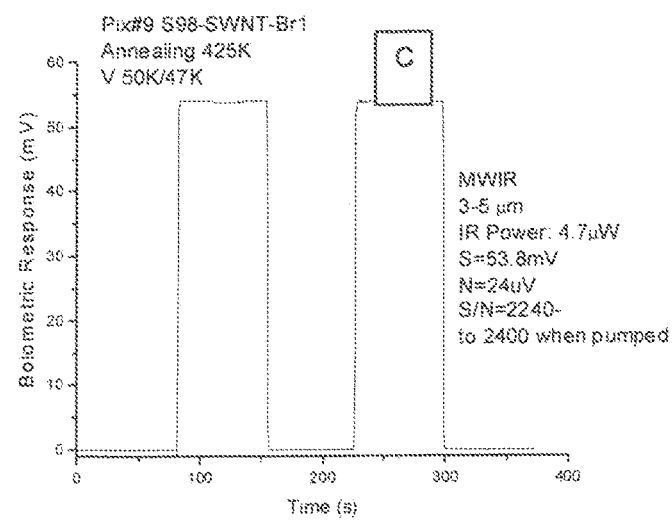
FIG. 27

PATTERNED FOCAL PLANE ARRAYS OF CARBON NANOTUBE THIN FILM BOLOMETERS WITH HIGH TEMPERATURE COEFFICIENT OF RESISTANCE AND IMPROVED DETECTIVITY FOR INFRARED IMAGING

This application claims the benefit of priority in U.S. Provisional Patent Application Ser. No. 62/431,070 filed on Dec. 7, 2016, the entirety of the disclosure of which is incorporated herein by reference.

TECHNICAL FIELD

This disclosure relates generally to the field of infrared (or thermal) imaging and infrared detection, and more particularly, a development of new materials for focal plane arrays (FPA) which can operate at room temperature and can be manufactured at low cost.

BACKGROUND

Applications for infrared (IR) detectors and their 2D focal plane arrays (FPAs) have undergone a dramatic expansion over the past several decades in the areas of thermal imaging, including night vision and other military applications, spectroscopy, infrared astronomy, space telescopes and failure analysis. At present, HgCdTe is the most widely used variable band gap semiconductor for infrared (IR) photodetectors in spite of its toxicity. There is a strong motivation to replace HgCdTe systems because of the processing problems, which originate from the weak Hg—Te bonds and give rise to bulk, surface and interface instabilities that make it difficult to develop large area uniform imaging arrays. The HgCdTe detector operates at 77K while its main competitor, the extrinsically doped Si detector, requires even lower temperatures (4.2K) for successful operation.

Low-cost IR imagers can be used in civil applications such as driving aids, aerospace, industrial process monitoring, community services, firefighting, portable mine detection, night vision, border surveillance, law enforcement, search and rescue.

In recent years alternative photonic and thermal detectors, which operate close to room temperature, have been sought for low-cost thermal imaging. Vanadium oxide, $VO_X$, is the most popular material currently utilized as an uncooled bolometer-sensing element and occupies about 70% of the commercial market. This sensing element is usually suspended above the silicon wafer based readout chip utilizing a thin $Si_3N_4$ bridge supported by two narrow $Si_3N_4$ legs to minimize the thermal coupling with the Si chip. The important characteristic of $VO_X$ is the metal to semiconductor phase transition in the range 70-50° C. resulted in a high TCR of 2-4% when the temperature is maintained in the region of the phase transition. Typical detectivity D* of VOx based microbolometers is at the level of $D^*=2\times10^8$ cm $Hz^{1/2}/W$. VOx based FPA technology is now mature and dominates the infrared imaging military and civil sectors of the commercial market for uncooled FPAs, but this technology has its own limitations because of difficulties in preparation as a result of the narrow stability range of stochiometric $VO_X$ and Joule heating of high resistivity VOx films.

Another popular material is amorphous Si (a-Si) currently occupying about 17% of the FPA market; this material has been investigated as a bolometer sensitive element for more than 30 years. The advantage of a-Si based microbolometers is that they are compatible with Si-based technology and wafer processing techniques. The TCR for a-Si ranges from 2.5 to 6% with high values corresponding to highly resistive materials. The resistance of a-Si sensitive elements is several orders of magnitude higher than for $VO_X$ which results in high noise and limits applications of this material.

Earlier generations of uncooled FPAs for infrared imaging were based on pyroelectric materials in which the change of temperature under incident infrared radiation causes a change in spontaneous polarization resulting in the generation of surface charges. This type of FPAs still occupies a significant part of the commercial market (about 13%). The pyroelectric detectors require mechanical chopping to modulate the source of energy which limits their applications. Other problems with pyroelectric detectors include their sensitivity to vibrations, hydroscopic nature and the poor long-term stability of some of pyroelectric materials.

Despite recent developments, the room temperature performance of thermal detectors is still modest and there is a strong demand for discovering new materials for uncooled IR imaging applications. Carbon nanotubes (CNTs) comprise a new class of carbon nanomaterials with outstanding mechanical, electrical and thermal properties that have a wide range of potential applications in nanoelectronics, field emitters, energy storage, chemical and biological sensors, and nanostructural composite materials for mechanical reinforcement, thermal management and electromagnetic shielding.

One type of CNTs, namely single-walled carbon nanotubes (SWNTs), possess unique electronic and optical properties due to their one-dimensional structure and they have already shown great promise in electronic and optoelectronic applications. In 2006 scientists from University of California-Riverside reported the discovery of a large photoresponse in suspended single-walled carbon nanotube (SWNT) thin films that extends across the whole electromagnetic spectrum (Itkis, M. E.; Borondic, F.; Yu, A.; Haddon, R. C., Bolometric Infrared Photoresponse of Suspended Single-Walled Carbon Nanotube Films. Science 2006, 312, 413-416; Haddon, R. C.; Itkis, M. E., Carbon Nanotube Based Detector, U.S. Pat. No. 7,723,684 (2010)). This study demonstrated that the strongly enhanced photoresponse is bolometric in nature. Electron-phonon interactions lead to ultrafast relaxation of the photoexcited carriers and the energy of the incident IR radiation is efficiently transferred to the SWNT crystal lattice causing the modulation of the SWNT film temperature. With this disclosure single-walled carbon nanotubes are emerging now as a great candidate for improved FPA materials.

The initial study at UC Riverside has demonstrated several attractive features, which show the potential of SWNT films to function as the sensitive element of an IR bolometric detector:

a) Efficient absorbance of IR radiation by SWNT thin film: The absorption coefficient of SWNTs is extremely high ($10^4$ to $10^5$ $cm^{-1}$), at least an order of magnitude greater than that of HgCdTe. The strong absorption of SWNT thin films includes the UV, Mid-IR and Far-IR spectral regions, the terahertz range and a 100 nm thick film absorbs>70% of the incident IR radiation.

b) Low mass and heat capacity of the SWNT sensitive element: At a thickness of 100 nm the SWNT film has an extremely low mass (nanograms), thus satisfying the low heat capacity requirement of the bolometer sensitive element thereby allowing the development of fast bolometric detectors.

c) Potential for achieving high TCR.

d) Feasibility of fabricating large arrays of SWNT-based IR bolometers: Current synthetic methods can be used to produce large area homogeneous SWNT thin films for the development of bolometer array fabrication technologies.

e) Low cost of SWNT material for 2D-arrays fabrication: The mass of the required SWNT sensitive element is in the nanogram range, and the total mass of SWNTs required for a 2D-array would be below 100 µg, which corresponds to a SWNT material cost below 10 cents per array.

f) Radiation damage resistance: A SWNT film can be envisioned as an extended network of SWNTs involving multiple conducting pathways which provides improved radiation damage resistance and highly reproducible transport and spectral properties Despite the high potential of CNTs in FPA applications some of the metrics of performance required for state of the art FPAs are not yet realized, in particular, TCR in the range 2 to 4% or higher. Also, compatibility of SWNT thin films with modern FPA fabrication technology has not been yet achieved including patterning and addressing SWNT thin film pixels. The present disclosure solves this and other problems.

SUMMARY

Embodiments of the present disclosure provide for a method of modifying carbon nanotubes (CNTs) by a one or both of chemical functionalization and physical processing in order to achieve high temperature coefficient of resistance (TCR) of CNT thin films for their applications as active sensitive elements of infrared microbolometers for focal plane arrays (FPAs) for infrared (or thermal) imaging.

The CNT material may take the form of single-walled carbon nanotubes (SWNTs), double-walled carbon nanotubes (DWNTs), few-walled carbon nanotubes (FWNTs) or multi-walled carbon nanotubes (MWNTs). SWNTs may be selected in a form of mixture of metallic and semiconducting SWNTs, or separated semiconducting SWNTs. The degree of separation of semiconducting SWNTs may be selected in the range 90% to 100%.

Chemical functionalization may be selected in the form of diazonium chemistry by reaction of CNT dispersion with a diazonium salt, for example bromobenzene diazonium salt, nitrophenyl diazonium salt, methoxy diazonium salt or other type of diazonium reactions.

Other types of chemical functionalization may include non-covalent or covalent chemistry with attachment to the CNT walls and ends octadecylamine functional groups, poly(m-aminobenzenesulfonic acid functional groups, polyethyleneglycol functional groups, amide functional groups, amino phenyl functional groups or other types of non-covalent or covalent chemistry.

Chemical functionalization may include organometallic complexation, Diels-Alder reactions, free radical reactions, reactions of reduced form of carbon nanotubes with various electrophiles (Birch reaction), and reactions with carbenes and nitrenes.

Chemical functionalization may include reactions which lead to ionic, noncovalent and covalent modification of the side-walls and ends of the carbon nanotubes.

Covalent chemical functionalization may include gas phase reactions which have particular advantages in the present application due to their compatibility with the patterning of the SWNTs and the fabrication of SWNT-based pixels by techniques such as laser patterning and lithography.

The gas phase reactions may conveniently include the generation of radical species such as hydrogen atoms, fluorine atoms, methyl radicals and other alkyl radicals which can attach directly to the SWNT sidewalls and may be carried out in vacuum.

The gas phase reactions may be carried out directly on the assembled SWNT pixels and FPAs in order to adjust the performance of the SWNT circuit elements and this can be monitored directly by measuring the resistances of the individual pixels in order to ensure the correct level of functionalization.

Other types of chemical functionalization may include a combination of covalent chemistry and non-covalent chemistry as consecutive steps.

Other type of chemical functionalization may include compensation of CNTs. In one implementation doping or compensation may be applied to separated semiconducting CNTs to compensate their natural p-doped state acquired due to interaction with atmosphere or chemical and physical processing procedures to restore the intrinsic state of semiconducting CNTs which corresponds to strongest temperature dependence of resistance and highest TCR. Possible compensating agents may be tetrakis(dimethylamino)ethylene or dibenzyl-viologen and other electron-donating compounds.

Compensation of CNT thin films to the intrinsic state may be achieved by electrostatic gating of individual CNT thin film pixels in FPAs.

The physical processing may be selected as a treatment of CNT dispersions in ultrasonic bath or with ultrasonic tip, shear mixing of CNT dispersion, annealing of thin films of CNTs in vacuum or under inert atmosphere or by combinations of these physical processing steps.

Another embodiment of the present disclosure provides methods of patterning of CNT thin films for FPA preparation.

In one implementation, patterning of FPA may be achieved by air-brushing of CNT dispersions in organic solvents utilizing shadow masks.

In another implementation, patterning of the FPA may be achieved by a focused laser beam which removes areas of continuous CNT film outside of the active pixel areas.

In the following description, there are shown and described embodiments of the presently disclosed methods and devices. As it should be realized, the described methods and devices are capable of other, different embodiments and their several details are capable of modification in various, obvious aspects all without departing from the devices and methods as set forth and described in the following claims. Accordingly, the drawings and descriptions should be regarded as illustrative in nature and not as restrictive.

BRIEF DESCRIPTION OF THE DRAWINGS

The accompanying drawing figures incorporated herein and forming a part of the specification, illustrate several aspects of the disclosed methods and devices, and together with the description serve to explain certain principles thereof. In the drawings:

FIG. 3A shows temperature dependence of resistance for films of unsorted and SC-SWNTs after annealing in vacuum at 380 K and 470 K;

FIG. 3B shows TCR values at 300K for films of unsorted and SC-SWNTs after annealing in vacuum at 380 K and 470 K;

FIG. 4A shows effect of prolonged (24 hours) ultrasonic treatment combined with vacuum annealing on temperature dependence of resistance for the films of SC-SWNTs;

FIG. 4B shows effect of prolonged (24 hours) ultrasonic treatment combined with vacuum annealing on TCR values at 300K for the films of SC-SWNTs;

FIG. 13A shows evaluation of TCR values of SC-SWNT films prepared utilizing physical processing and NP-functionalization at different annealing temperatures;

FIG. 13B shows evaluation of TCR(300K) values of SC-SWNT films prepared utilizing physical processing and NP-functionalization at different annealing temperatures;

FIG. 14 shows chemical structure of bromo-phenyl functionalized SWNTs;

FIG. 21A shows SWNT-ODA continuous thin film transferred over mylar film with pre-deposited gold interconnects;

FIG. 21B shows laser patterning of SWNT thin films prepared by thin film transfer;

FIG. 22 shows a microscope image and optical transmittance scan of the SWNT thin film sample patterned by laser cutting according to FIGS. 21A-21B;

FIG. 23 shows visible microscopy of laser patterning with reducing feature size from 100 μm (Left) to 50 μm (Right) channels using advanced laser technology. Overlaying line traces show results of optical transmittance scans across the patterns;

FIG. 24A shows continuous SWNT thin film transferred on a substrate with rectangular shape trenches of 100 μm side size;

FIG. 24B shows effects of laser cutting of the SWNT film of FIG. 24A to form a ten-pixel linear array of SWNT thin film bolometric detectors suspended over trenches and individually addressed by gold interconnects;

FIG. 25A shows a microscope image of individual pixel of SWNT thin film IR bolometric detector of characteristic size of 100 μm;

FIG. 25B shows the response for SC-SWNT thin film bolometer before chemical functionalization to IR radiation of incident power 4.7 μW in mid-wave infrared (MWIR) spectral range;

FIG. 25C shows the response to the same incident radiation power of similar SWNT bolometric detector after chemical functionalization utilizing diazonium chemistry with bromophenyl group. After chemical functionalization the amplitude of the photoresponse increased ~2000 times from ~2.5 μW to 53 mV and the signal-noise ratio increased ~150 times from 16 to 2400;

FIG. 26A shows the testing of the pyroelectric detector DSS-LT020A/BAF2 from HORIBA JOBIN YVON in MWIR spectral range under incident power of 4.7 μW;

FIG. 26B shows ~3 mV signal;

FIG. 26C shows noise of ~5-7 μV with resulting signal to noise ratio (S/N) of ~500; and FIG. 27 shows the response to the same MWIR radiation power of the SWNT-based microbolometer prepared from SC-SWNTs after optimized physical processing and diazonium (bromophenyl) functionalization showing S/N=2400, which is more than 3-4 times better than for a commercial pyroelectric detector.

Reference will now be made in detail to embodiments of the disclosed methods and devices, examples of which are illustrated in the accompanying drawing figures.

DETAILED DESCRIPTION

Embodiments of the present disclosure provide for a method of modifying carbon nanotubes (CNTs) by one or both of chemical functionalization and physical processing in order to achieve high temperature coefficient of resistance (TCR) of CNT thin films for their applications as active sensitive elements of infrared microbolometers for focal plane arrays (FPAs) for infrared (or thermal) imaging.

Figure 1:
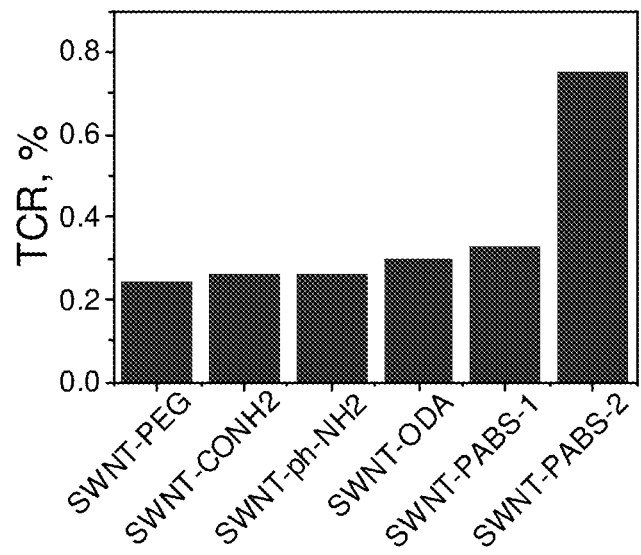
FIG. 1 shows TCR values at 300K for different types of unsorted functionalized SWNTs.

The existing data on thin films of unsorted SWNTs, i.e. SWNT bulk material which consist of a mixture of semiconducting (SC) and metallic (MT) SWNTs in typical statistical ratio SC:MT=2:1 show TCR values in the range 0.05 to 0.3. TCR values on chemically functionalized unsorted SWNTs are presented in FIG. 1 and are in the range 0.2-0.7% thus showing only marginal increase of TCR.

Figure 2:
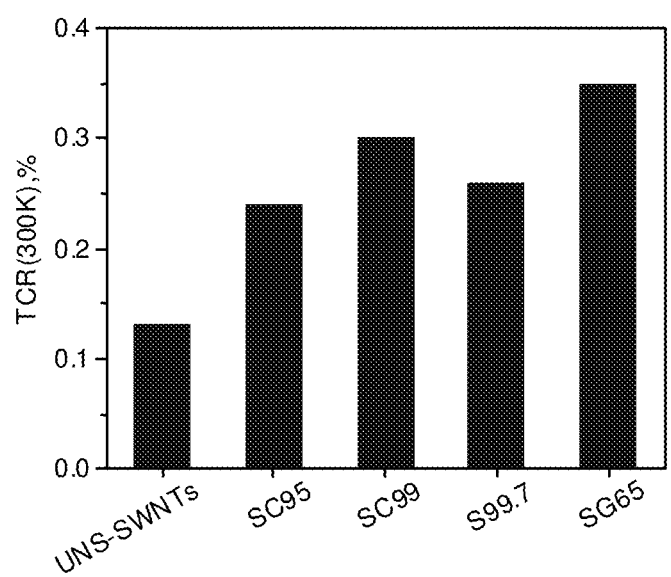
FIG. 2 shows TCR (300K) values for thin films of sorted semiconducting SWNTs of different degree of semiconducting type purity.

Application of separated SC-SWNTs in place of nonsorted (or unsorted) SWNTs (NS- or UNS-SWNTs) typically containing a mixture of MT- and SC-SWNTs in a ratio 1:2 was expected to result in high TCR values. However, thin films of separated semiconducting SWNTs show TCR value in the range 0.2-0.4% even for very high degree of separation of SC-SWNTs of 99.7% (FIG. 2).

Physical treatment in a form of vacuum annealing of SC-SWNT thin films leads to only small increase of TCR from 0.28 to 0.3% (FIG. 3).

Physical treatment in a form of extended bath sonication does not lead to increasing TCR above 0.3% (FIG. 4). Combination of extended bath sonication with annealing of SC-SWNT film in vacuum leads to a small increase of TCR to ~0.4% which is not sufficient for bolometric detector applications (FIG. 4).

Embodiments of the disclosure provide a combination of different types of physical treatment as a method for increasing TCR of films of semiconducting SWNTs. For example, the combination of ultrasonic bath treatment of SWNT dispersions, shear-mixing of SWNTs dispersion, and vacuum annealing of SWNT films made of shear-mixed and ultrasonicated SC-SWNTs may lead to TCR reaching but not limited to a value of 2.4% (FIG. 5) comparable to TCR values of VOx which currently dominates the FPA market.

Figure 6:
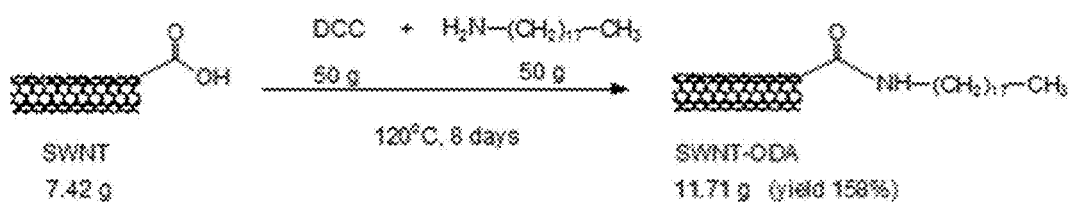
FIG. 6 shows synthesis of octadecylamine functionalized SWNTs (SWNT-ODA)
Figure 9:
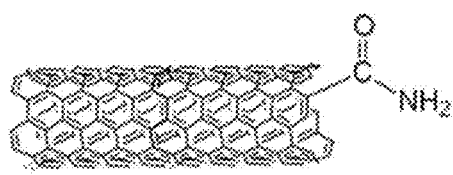
FIG. 9 shows structure of SWNT-CONH$_2$.
Figure 10:
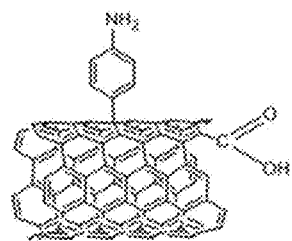
FIG. 10 shows structure of SWNT-Ph-NH$_2$.

Other embodiments of the disclosure introduce different chemistries of SC-SWNT walls, such as octadecylamine (ODA) functionalization (FIG. 6), PABS functionalization (FIG. 7), polyethyleneglycol functionalization (FIG. 8), amide functionalization (FIG. 9), and amino phenyl functionalization (FIG. 10) as a method to achieve high TCR.

Figure 11:
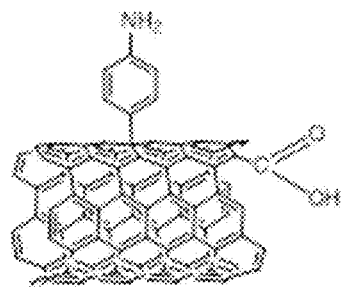
FIG. 11 shows chemical structure of nitro-phenyl functionalized SWNTs.
Figure 12A:
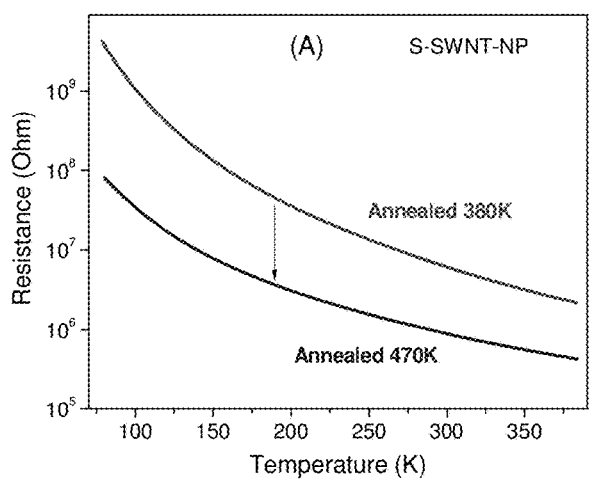
FIG. 12A shows: temperature dependence of resistance of thin films of nitrophenyl functionalized SC-SWNTs (SC-SWNT-NP) annealed at 380 K and 470 K for a SC-SWNT-NP film annealed in vacuum at 380 K and 470 K.

According to other embodiments, solution phase diazonium reactions may be applied to SC-SWNTs to achieve high TCR. Diazonium salts with different substituents on the aromatic ring exploring the different charge transfer ability of the substituents may be applied. As an example, nitrophenyl (NP) functionalization (FIG. 11) may be applied to SC-SWNTs and TCR of ~1.5% or higher may be achieved (FIG. 12). This NP functionalization of semiconducting SWNTs results an improvement in TCR values which become comparable to TCR values of vanadium oxide material currently dominating the FPA market.

According to another embodiment, combination of shear-mixing and sonication may be applied to SC-SWNT material following the nitro-phenyl functionalization procedure. The resulted thin films of this material may be annealed in vacuum and high TCR values of 4% (FIG. 13), higher than typical TCR values of vanadium oxide bolometers currently dominating the FPA market, may be achieved.

According to another embodiment, diazonium functionalization with bromo-phenyl substituent may be applied to SC-SWNT material (FIG. 14), for example, processed by a combination of prolonged sonication and shear mixing. This type of functionalization may allow achieving TCR as high of 4.1% (FIG. 15) exceeding typical TCR values of vanadium oxide bolometers currently dominating the FPA market.

According to another embodiment, diazonium functionalization with methoxy substituent may be applied to SC-SWNT material, for example, processed by a combination of prolonged sonication and shear mixing. This type of functionalization may allow achieving TCR as high as 4.65% (FIG. 16) exceeding typical TCR values of vanadium oxide bolometers currently dominating the FPA market.

According to another embodiment, chemical functionalization may be applied to the films of SC-SWNT material, i.e. to SC-SWNT material in solid state, for example, processed by a combination of prolonged sonication and shear mixing. This solid-state functionalization is an efficient alternative to the solution state functionalization procedure and may allow achieving TCR of 2.8% and higher (FIG. 17) compatible with state of the art FPA technology. Examples of such solid-state functionalization include, but not limited by diazonium chemistry with a number of different substitutes including, but not limited by nitrophenyl, bromine phenyl or methoxy phenyl substitutes.

Figure 18:
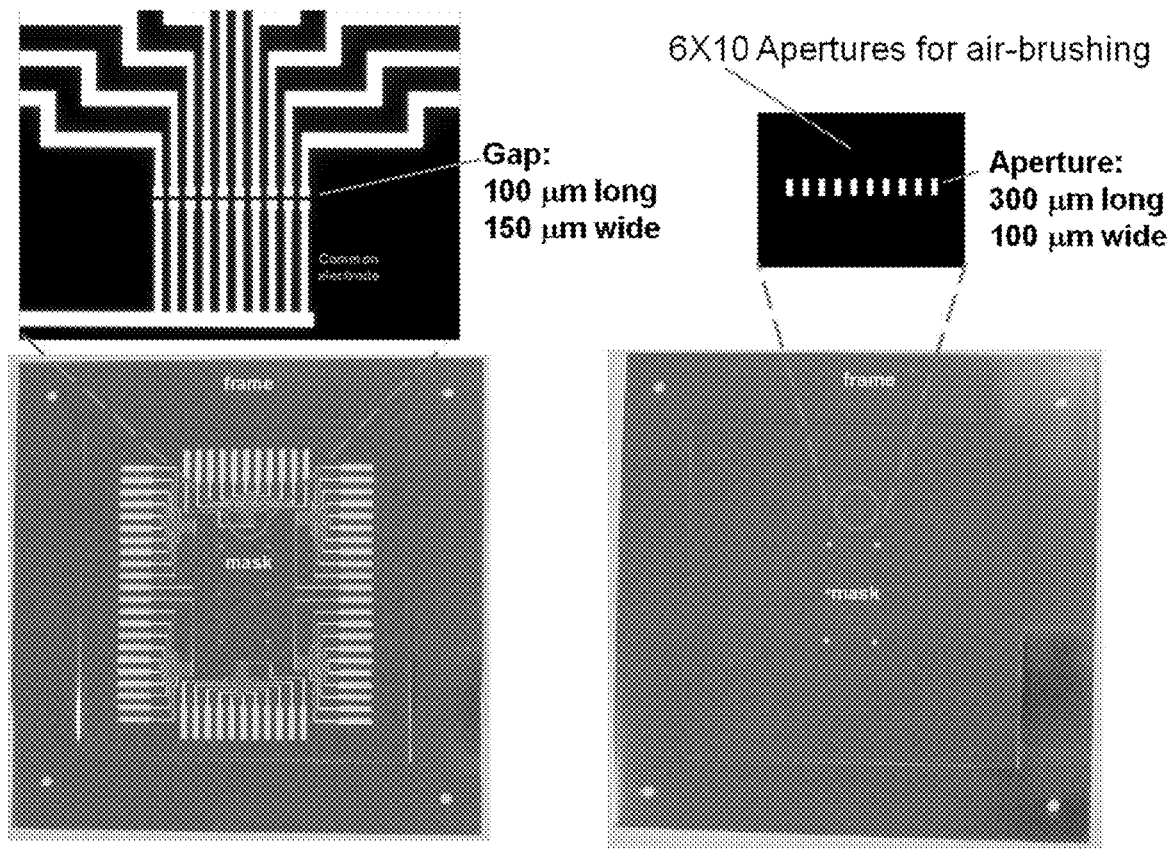
FIG. 18 shows two complementary high precision masks for air brush based on patterning of 60 pixels arrays of SWNT thin film bolometers.
Figures 19A, 19B, 19C:
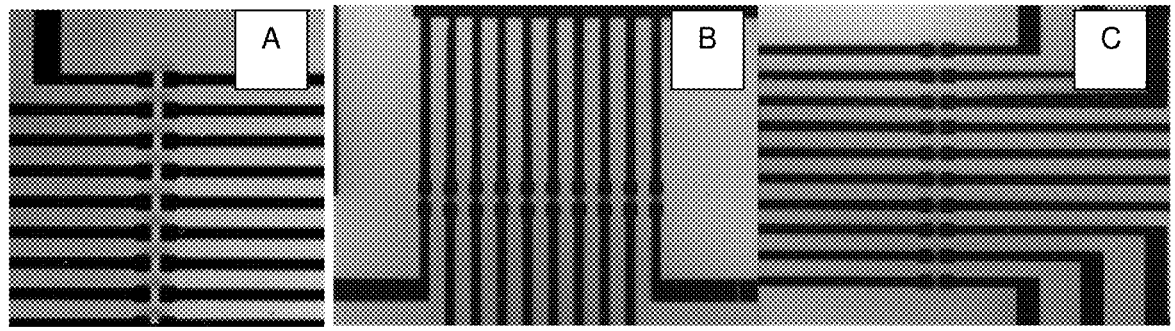
FIG. 19A shows results of high temperature air brushing: SWNT pixels shifted from gold electrodes due to strong thermal expansion mismatch of mylar and nickel mask.
FIG. 19B shows results of room temperature air brushing: uniform SWNT pixel deposited over gold electrodes.
FIG. 19C shows another example of results of room temperature air brushing: uniform SWNT pixel deposited over gold electrodes.
Figure 20:
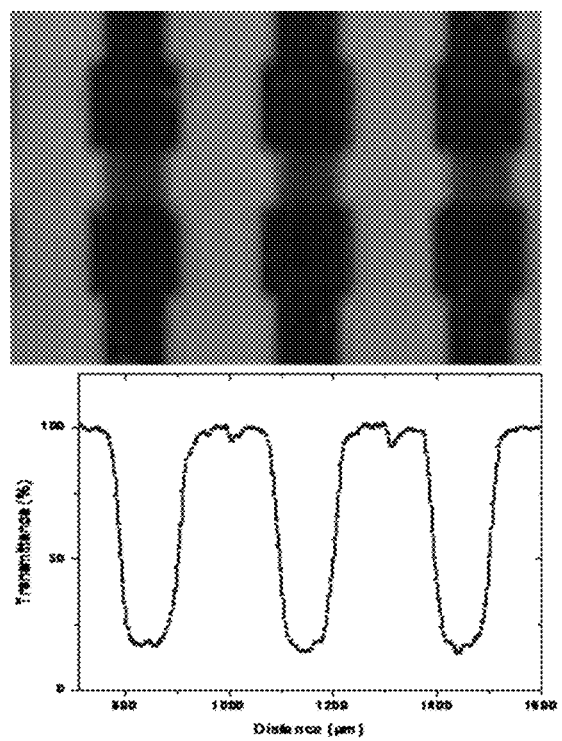
FIG. 20 shows a microscope image and optical transmittance scan of the SWNT thin film sample patterned by air-brushing according to FIGS. 19A-19C.

Patterning of CNT FPAs, according to embodiments of the present disclosure, may be achieved by air-brushing technique in which CNTs are deposited from CNT dispersions in organic solvents onto FPA platform through precision shadow masks (FIG. 18-20).

According to another embodiment, patterning of CNT FPAs may be achieved by laser cutting of CNT thin films utilizing focused laser beam with spatially controlled positioning with lasers operating on infrared, visible or UV emission wavelength (FIG. 21-23).

In one embodiment, the CNT thin films are comprised of random network of CNTs. In another embodiment, the thin films are comprised of aligned CNTs with the nanotubes aligned parallel to the electrodes. According to another embodiment, the thin films are comprised of aligned CNTs with the nanotubes aligned perpendicular to the electrodes.

The following examples illustrate embodiments of the disclosure, but should not be viewed as limiting the scope thereof.

Example 1: TCR Values of Thin Films of Unsorted Functionalized SWNTs and Sorted SC-SWNTs of Different Semiconducting Purities The existing data on thin films of unsorted SWNTs, i.e. SWNT bulk material which consist of a mixture of semiconducting (SC) and metallic (MT) SWNTs in typical statistical ratio SC:MT=2:1, show TCR values in the range 0.05 to 0.3. TCR values on chemically functionalized unsorted SWNTs are presented in FIG. 1 and are in the range 0.2-0.7% thus showing only marginal increase of TCR.

Room temperature TCR values for sorted semiconducting SWNTs (SC-SWNTs) were evaluated in SWNT materials with varying degree of separation of semiconducting and metallic SWNTs:

1) NS-SWNTs—Unsorted (67% semiconducting/33% metallic) SWNTs;
2) SC95-SWNTs—(95% semiconducting/5% metallic) sorted SWNTs;
3) SC99-SWNTs—(99% semiconducting/1% metallic) sorted SWNTs;
4) SC99.7-SWNTs—(99.7% semiconducting/0.3% metallic) sorted SWNTs; In addition, TCRs of thin films of smaller diameter SWeNT SG 65 (6,5)-SWNTs were evaluated. The SWNTs had an average diameter of 0.8 nm and contain more than 90% of semiconducting SWNTs (less than 10% metallic). These SWNTs have a larger energy gap of ~1.25 eV in the electronic density of states which in the case of conventional semiconductors would lead to an increased TCR.

The SWNT films of the above materials were in situ annealed in vacuum at 110° C. and their TCRs were measured without exposure to atmosphere. The results are presented in FIG. 2.

The TCR(300K) is slightly higher in the case of the SG65 film (TCR ~0.35%) corresponding to the larger semiconducting energy gap, while no significant dependence was observed for different degrees of separation of semiconducting SWNTs of larger diameter with low TCR values in the range 0.25-0.3%.

Example 2: Effect of Vacuum Annealing on TCR of SWNT Films

Thin films of SWNTs of two different types of SWNT material were explored:
1) Nonsorted SWNTs (NS-SWNTs);
2) 99% semiconducting SWNTs (S99).

Effect of annealing in vacuum at 380 K and 470 K was explored. FIG. 3 summarizes the results of this study.

For thin films of unsorted SWNT films the resistance increases by ~2 times while the TCR at 300K remains low ~0.13% despite the annealing. For thin films of SC-SWNTs one order of magnitude increase of the film resistance was observed, but the increase of TCR was very small: from 0.28 to 0.3% at 300K. Thus, physical treatment in the form of vacuum annealing is not able to materially improve the TCR.

Example 3: Effect of Combination of Ultrasonic Bath Treatment and Vacuum Annealing on TCR of SWNT Films FIG. 4 shows a set of data for S99%-SWNTs prepared utilizing prolonged ultrasonic bath treatment for 24 hours. The resistance of the film is ~3 times higher than for S99%-SWNT film prepared without extended sonication, but the TCR values did not change significantly remaining in the vicinity of 0.3%. Increasing the annealing temperature to 470 K led to an increased resistance and an insignificant increase of TCR to ~0.4%. Thus, physical treatment in the form of prolonged ultrasonication even combined with vacuum annealing is not sufficient for improving the TCR.

Figures 5A, 5B:
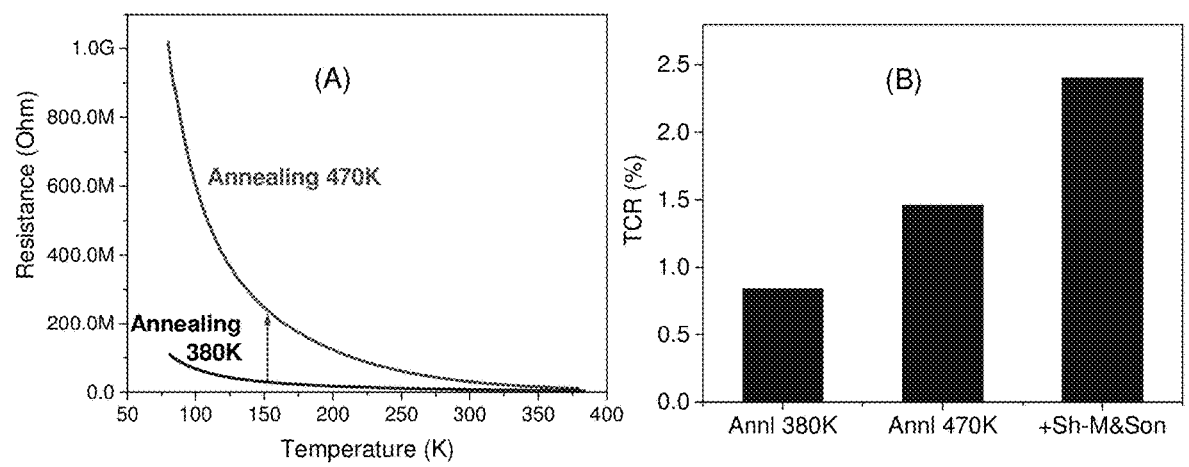
FIG. 5A shows effect of combination of different types of physical treatment sonication, shear mixing and annealing on temperature dependence of resistance for the films of SC-SWNTs.
FIG. 5B shows effect of combination of different types of physical treatment sonication, shear mixing and annealing on TCR values at 300K for the films of SC-SWNTs.

Example 4: The Effect of a Combination of Ultrasonic Bath Treatment, Shear-Mixing and Vacuum Annealing on TCR of SWNT Films Sonication of SC-SWNT dispersions in water was combined with shear mixing in the form of four 10 minute shear mixing cycles inserted within the 24 hour ultrasonic bath treatment. The resistance of the films increased by several orders of magnitude, especially, at low temperatures (FIG. 5A). The TCR value at 300K exceeded 0.8% after additional annealing at 380 K (FIG. 5B).

Next, a vacuum annealing at higher temperature 470K was applied to the same SC-SWNT films prepared by a combination of sonication and shear mixing.

A strong increase of resistance was observed; more importantly, TCR at 300K increases from ~0.8% to ~1.5% as shown in FIG. 5. Further increasing the number of shear-mixing and sonication cycles before the film preparation lead to TCRs as high as 2.4%.

Chemical Functionalization of SWNTs

Example 5: Synthesis of ODA Functionalized SWNT (SWNT-ODA)

Present example (FIG. 6) shows the one-step reaction of SWNT-COOH with ODA in dimethylformamide (DMF) using N,N'-dicyclohexylcarbodiimide (DCC), as the coupling agent.

Example 6: Synthesis and Purification of PABS Functionalized Unsorted SWNTs

Figure 7:
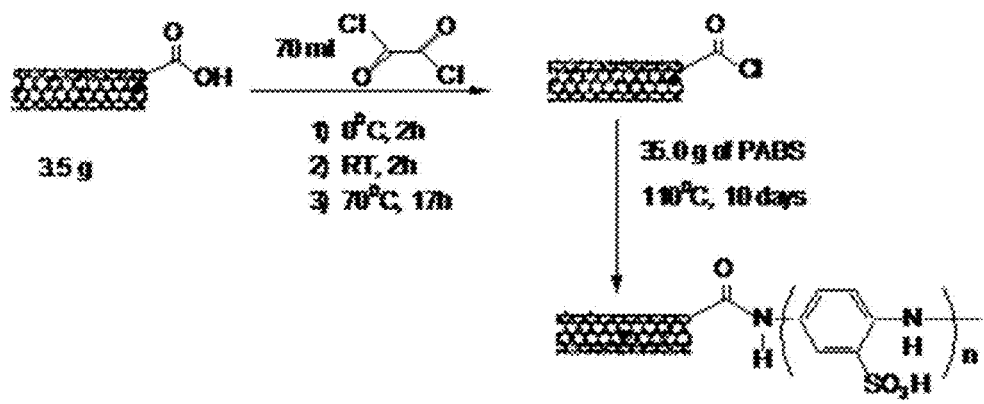
FIG. 7 shows synthetic procedure for the preparation of SWNT-PABS at 10-g scale.

In the present example, the synthesis of SWNT-PABS material at the 10 g scale is described (FIG. 7). Preparation of polyaminobenzoic acid (PABS): In a 1 L round bottom flask (vessel #1), 13.8 g of the monomer, animobenzene sulfonic acid (ABS) was dispersed at RT in 480 mL of 1M HCl; then 1.6 mL of aniline was added and stirred at RT for about 30 min. In a 250 mL conical flask (#2), 27 g of $(NH_4)_2S_2O_8$ was dissolved in 100 mL of 1M HCl. The mixture in the flask #1 was cooled to 0° C. and the oxidant from flask #2 was slowly added by plastic pipette (~45 min). After addition, the resulting mixture was stirred at 0° C. for 6 h, then at room temperature overnight. The following day, 480 mL of solvent was removed on a rotary evaporator (the water bath ~35° C.), the residue was cooled in ice and filtered (Fluoropore, 0.22 μm). The flask was washed with a small amount of HCl to give the product as a black-brown precipitate, which was washed 3-4 times with acetone and dried in a desiccator. Typical yield is ~70-80%.

Preparation of SC-SWNT-PABS. In the next step, 10 mg of the PABS was mixed with 5 mL of SC-99 suspension containing 0.05 mg of SC-SWNTs. This mixture was stirred for 20 hrs at room temperature in order for the PABS to fully access the SWNTs. The resulting mixture was filtered with an alumina filter and washed with water until the filtrate became colorless. The SC-SWNT-PABS film which formed on the filtration membrane was used for the TCR evaluation.

The mid-IR spectra confirmed the formation of a covalent bond between the SWNT and PABS: the spectra show a stretching vibration at ~1650 $cm^{-1}$ due to carbonyl in the amide groups, peaks in the range of 2850-2920 $cm^{-1}$ corresponding to the aromatic C—H stretching vibrations and a peak at 695 $cm^{-1}$ due to S—O stretch. The thermo gravimetric analysis (TGA) showed the weight loss profile and the metal content in the SWNT-PABS materials from which the loading of the PABS was estimated to be 66% and the metal residue was estimated to be 2.0%.

Example 7: Synthesis of Polyethyleneglycol-600 Functionalized SWNTs (SWNT-PEG)

1 g of SWNT-COOH was dried for 2 h at 100° C. and sonicated in 750 mL anhydrous DMF for 4 h and homogenized for 30 minutes. The nanotubes dispersion was stirred overnight at room temperature under Ar atmosphere, cooled to 0° C. and 20-25 mL of oxalyl chloride was slowly added. The reaction mixture was additionally stirred for 1 h at 0° C. and for 1 h at room temperature and then heated and stirred at 70° C. under a flow of Ar overnight to remove the excess oxalyl chloride. After this step the mixture was cooled to room temperature under Ar and 10.0 g of PEG-600 was added and the mixture heated and stirred at 120° C. for 5 days.

The resulting solution was cooled to room temperature, filtrated on a 90 mm 0.2 μm Fluoropore filter membrane and washed by soxhlet extraction with DMF until the filtrate was colorless. Washing continued with DI water until the filtrate was colorless. The resulting material was filtered on a 90 mm 0.2 µm Durapore membrane and the black solid was dried at room temperature under vacuum in a desiccator. The dried material was ground and washed additionally by soxhlet with DI water, and dried again in a desiccator under vacuum. The typical yield is 110%. The SWNT-PEG (FIG. 8) was characterized using AFM, mid IR spectroscopy, near-infrared (IR) spectroscopy and TGA analysis.

Example 8: Synthesis of Amide Functionalized SWNTs (SWNT-CONH$_2$)

The synthesis of SWNT-CONH$_2$ was carried out using the same oxalyl chloride addition procedure as explained for SWNT-PEG but the functionalization was performed by purging the suspension with ammonia gas at 0° C. for 4 h. The resulting solution was warmed to room temperature, filtered and washed by soxhlet extraction with DMF and DI water until the sample was clean. The resulting black solid was dried at room temperature under vacuum in a desiccator. Typical yield is 100%. The final SWNT-CONH$_2$ material (FIG. 9) was characterized using AFM, mid IR spectroscopy, near-infrared (IR) spectroscopy and TGA analysis.

Example 9: Synthesis of Amino Phenyl Functionalized SWNTs (SWNT-pH-NH$_2$)

2.75 g of SWNT-COOH was dried at 100° C. and sonicated in 450 mL DMF for 4 h and homogenized for 1 h. This mixture was purged with Ar overnight and protected from light during further reaction. 8.7 g of tetra butyl ammonium fluoroborate and 1.4 g of nitrophenyl diazonium fluoroborate were added to this mixture and stirred for 24 h and sonicated for another 30 min. The nitrophenyl functionalized SWNTs were filtered and soxhlet extracted with DMF and reduced to the aminophenyl derivative by heating with Na$_2$S at 60° C. for 20 h. The final SWNT-ph-NH$_2$ material (FIG. 10) was filtered and washed by soxhlet extraction with water and acetone and characterized by spectroscopic methods.

Example 10: Nitro-Phenyl Functionalization of SC-SWNTs

Diazonium reactions can be applied to SC-SWNTs utilizing a variety of diazonium salts with different substituents on the aromatic ring allowing the introduction of substituents with a range of charge transfer properties. Nitro-, Bromo-, and Methoxy-substituted aryl groups were explored. The nitro-phenyl (NP) diazonium salt was obtained from Sigma-Aldrich. The nitro-phenyl diazonium salt (0.007 g) was added to a suspension of SWNTs (0.08 mg) in acetonitrile (8 mL). The mixture was stirred for 30 min at room temperature. The color of the suspension changed from pink to green indicating the chemical modification of SWNTs. After 30 min, 15 mL of acetone was added to precipitate the SWNTs and the dispersion filtered and the resulting solid washed with acetone and water. This NP modified material (FIG. 11) was then re-dispersed in DMF and filtered on an alumina membrane. The resulted SC-SWNT-NP film was used for TCR evaluation.

Example 11: TCR of Films of Nitro-Phenyl Functionalized SC-SWNTs

Figure 12B:
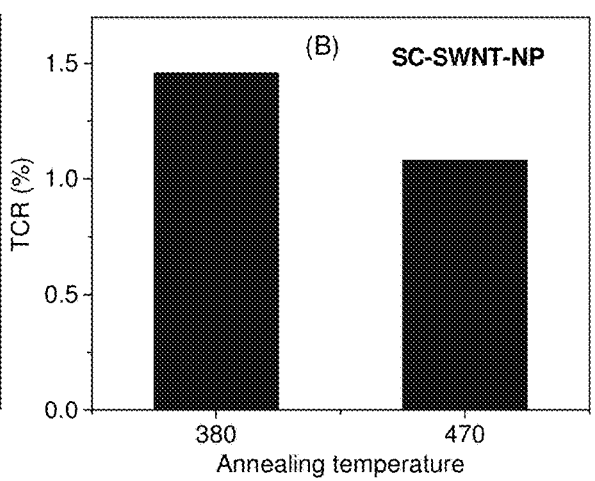
FIG. 12B shows: TCR values at 300 K for a SC-SWNT-NP film annealed in vacuum at 380 K and 470 K.

Nitro-phenyl functionalized SC-SWNT-NP material showed much higher resistance values (1-10 MOhm at 300K) than the SC-SWNT-PABS material and much stronger R(T) dependence with R(80K)/R(300K)>100 as can be seen in FIG. 12. Annealing at 380K resulted in a TCR=1.46% (FIG. 12B), matching the best value achieved for SC-SWNT material by application of shear-mixing and sonication (FIG. 5). In contrast to the case of SC-SWNT-PABS material the high temperature annealing of S-SWNT-NP film at 470K resulted in an overall decrease of resistance by ~10 times and a decrease of TCR(300K) to 1.08% (FIG. 12B).

Thus, NP functionalization of semiconducting SWNTs results in an improvement in TCR values as compared to previously explored types of chemistry.

Example 12: Combination of Physical Processing and Nitro-Phenyl Functionalization of SC-SWNTs Resulted in Improving TCR NP functionalization was applied to the SC-SWNT material processed by a combination of prolonged sonication and shear mixing. SC-SWNTs were shear-mixed 8 times for 10 min each and sonicated for 24 h in total. This shear mixed SC-SWNT material was utilized for NP modification. The SWNT to NP ratio was varied from 0.04 mg SWNT: 3 mg NP to 0.04 mg SWNT: 7 mg NP.

This shear-mixed, sonicated and NP modified material was re-dispersed in DMF and filtered on an alumina membrane. Different annealing temperatures were applied before TCR evaluation. FIG. 13 shows TCR as high as 4.0% achieved utilizing a combination of physical treatment and chemical modification.

Thus, the combination of physical processing and nitro-phenyl functionalization of SC-SWNTs may allow the attainment of TCR values as high as 4.0% exceeding typical TCR values of vanadium oxide materials which currently dominate the market for uncooled FPAs.

Example 13: Bromo-Phenyl Functionalization of SWNTs

The use of diazonium salts with a variety of different substituent on the aromatic ring allows the exploration of effect of the electronic character of the substituent on the device performance. In the present case the bromine atom is π-electron donating as opposed to the electron withdrawing nature of the nitro group. Of course other factors such as steric hindrance due to the size of the groups and the electronic state of the reacting nanotubes may play a role in these reactions. The resulting SWNT-bromo-phenyl complex is presented schematically in the FIG. 14.

Extended sonication and shear-mixing were applied to the starting SC-SWNTs material and the chemical procedure was as follows. Briefly, 2.4 mg of 4-bromo benzene diazonium salt was added to a 25 mL acetonitrile suspension of S-99 SWNTs (0.025 mg). The mixture was stirred for 30 min at room temperature. The color of the suspension changed to light yellow indicating the chemical modification of SWNTs. After 30 min, 5-10 mL of acetone was added to precipitate the SWNTs and the solid was separated by filtration and washed with acetone and water. The bromo-phenyl modified SWNT material was then re-dispersed in water and filtered on an alumina membrane. The resulted SC-SWNT-Br-Phenyl film was used for TCR evaluation.

The temperature dependence of the resistance was measured on two different SC99-SWNT-Br-Phenyl channels one of which was pre-annealed in vacuum at 200 C for 7 hours.

Figure 15A:
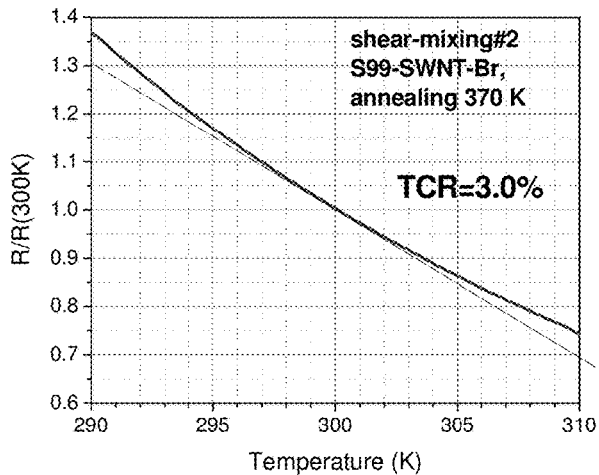
FIG. 15A presents graphical evaluation of TCR at 300K of functionalized S99-SWNT-Br film after annealing at 370. Starting S99-SWNT material was shear-mixed and sonicated before the functionalization.
Figure 15B:
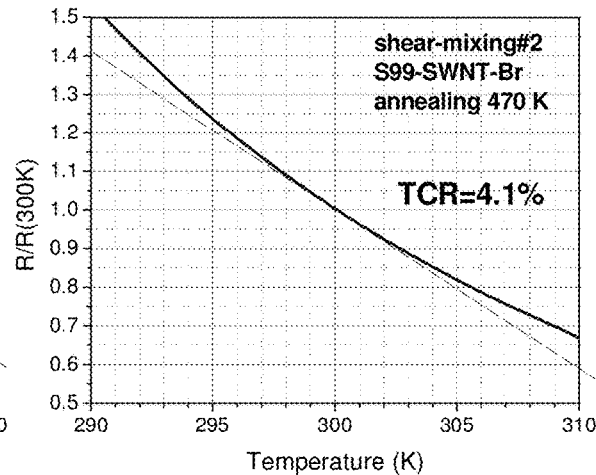
FIG. 15B presents graphical evaluation of TCR at 300K of functionalized S99-SWNT-Br film after annealing at 470K. Starting S99-SWNT material was shear-mixed and sonicated before the functionalization.

With increasing annealing temperature, the TCR at 300K increased from 3.0 to 4.1% (FIG. 15).

Thus, the bromine substituted diazonium functionalization of SC-SWNTs combined with physical processing allows the development of a material with a TCR as high of 4.1% exceeding the typical TCR values of vanadium oxide materials which currently dominate the market of uncooled FPAs.

Example 14: Methoxy-Phenyl Functionalization of SWNTs

Methoxy-phenyl functionalization was carried out in a similar manner to that of NP functionalization; the MeO substituent is π-electron donating in nature. Briefly, 2.6 mg of 4-methoxy benzene diazonium salt was added to a 25 mL acetonitrile suspension of SC-99 SWNTs (0.025 mg). The mixture was stirred for 30 min at room temperature. The color of the suspension changed from pink to pink-orange indicating the chemical modification of SWNTs. After 30 min, 5-10 mL of acetone was added to precipitate the SWNTs and the solid was filtered and washed with acetone and water. This methoxy-phenyl modified material was then re-dispersed in DMF and filtered through an alumina membrane. The resulting SC-SWNT-MeO-Phenyl film was used for TCR evaluation.

Figure 16A:
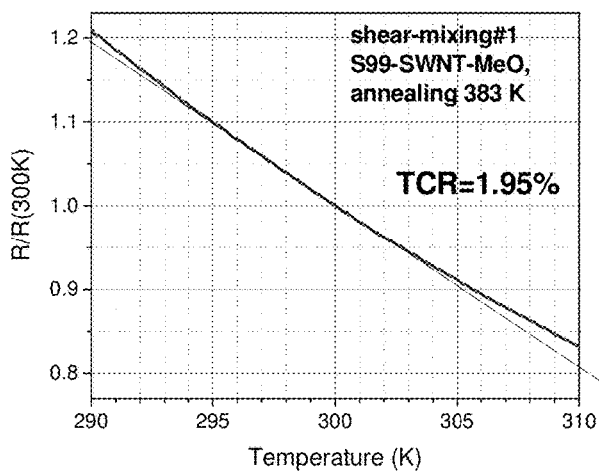
FIG. 16A shows TCR evaluations of SC-SWNT material processed by combined sonication and shear-mixing treatment.
Figure 16B:
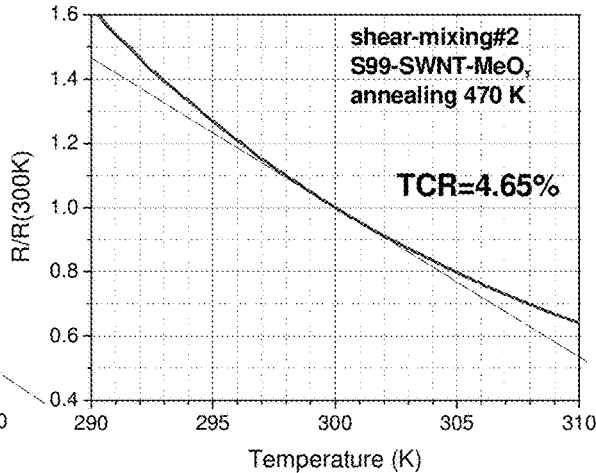
FIG. 16B shows TCR evaluations of SC-SWNT material processed by combined sonication and shear-mixing treatment and SC99-SWNT-MeO-Phenyl functionalized material.

FIG. 16 compares TCR values of SC-SWNT material processed by combined sonication and shear-mixing treatment and SC99-SWNT-MeO-Phenyl functionalized material and shows that TCR significantly increases from 1.95 to 4.65% indicating high potential of this new type of chemical functionalization for FPA applications.

Example 15: Chemical Functionalization Applied to the Films of SC-SWNTs

Figure 8:
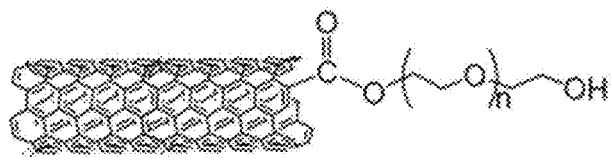
FIG. 8 shows structure of SWNT-PEG.
Figures 17A, 17B:
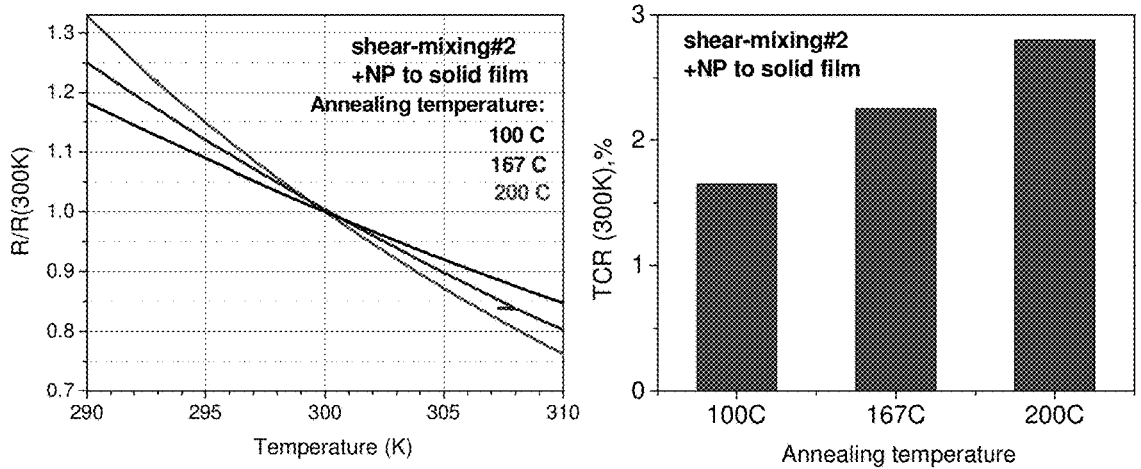
FIG. 17A presents an evaluation of TCR obtained for the shear-mixed SC-SWNT material NP-functionalized in a solid-state film form.
FIG. 17B presents an evaluation of resulting TCR values obtained for the shear-mixed SC-SWNT material NP-functionalized in a solid-state film form.

Nitrophenyl functionalization was applied directly to films of SC-SWNT material processed by a combination of prolonged sonication and shear mixing. After the functionalizations, 3 regimes of vacuum annealing at increasing temperature from 100° C. to 200° C. were applied to different films and the temperature dependence of resistance and TCR of the films were measured after each annealing. FIG. 8 shows that the resistance of the films increases by more than order of magnitude with increasing annealing temperature. FIG. 17 shows an increasing slope of R(T) and TCR values which reach 2.8% with increasing annealing temperature.

Thus, solid state functionalization is an efficient alternative to the solution state functionalization procedure and may allow TCR values of 2.8% and higher.

Example 16: SWNT Thin Film Array Patterning by Air-Brushing

An array of 60 SWNT thin film pixels of dimension 100×100 µm$^2$ was fabricated on a mylar substrate by using an air-brushing technique. The complete array consisted of 6 linear ten pixels arrays oriented in two orthogonal directions and distributed over an area of 40×40 mm$^2$. Two different high precision nickel masks with complementary patterns were utilized (FIG. 18). The first mask was utilized for e-beam deposition of gold interconnecting lines addressing individual pixels; it featured 100 µm gaps between the gold electrodes. The second matching mask had 300 µm×100 µm apertures for SWNT air-brushing.

For air-brushing the SWNTs were dispersed in an organic solvent using am ultrasonic bath. Typically, the substrate for air-brushing is heated to promote efficient solvent evaporation. In the case of the patterned array, when air brushing was applied to a mylar film heated to 110° C., the mismatch in the thermal expansion coefficients of the nickel mask and the mylar film complicates the procedure. This mismatch may interfere with the registry between the deposition of SWNT pixel and the gold electrodes as shown in FIG. 19A. To avoid this mismatch the air brushing may be applied to mylar film held at room temperature; in this case the SWNT pixels match positions of the addressing gold interconnects as shown in FIG. 19 B, C for two orthogonal orientations of the linear arrays.

The quality and resolution of the air-brush patterning was evaluated by scanning the optical transmittance across the linear array of the SWNT pixels. FIG. 20 shows spatial modulation of optical transmittance which is periodic in shape and depth thus confirming the feasibility of patterning utilizing air-brush techniques.

Example 17: Laser Beam Patterning of Continuous SWNT Thin Film

For laser patterning SWNT thin films were transferred onto a mylar film with pre-deposited gold interconnects as shown in FIG. 21A.

The results of patterning a continuous SWNT thin film using a focused laser beam are presented in FIG. 21B. The laser wavelength may be in the infrared, visible or UV spectral range dependent on substrate type and the feature size of the patterning. The top of the 10 pixels in FIG. 21B have a common electrode and do not need to be separated. The 10 interconnects addressing the bottoms of each pixel are separated by the laser beam patterning and the shape of each pixel is well defined as confirmed by an optical transmittance scan in FIG. 22.

The patterning feature size utilizing the laser cutting technique can be reduced to sub-20 µm feature size compatible with state of the art FPAs. As an example, FIG. 23 shows laser patterned stripes in a SWNT film with feature size reduced from 100 µm to 50 µm size with very uniform and homogeneous pattern of the SWNT coating.

Example 18: Laser Beam Patterning of Suspended Pixels of SWNT Thin Films

A linear pattern of 10 trenches of square shape with 100 µm sides and a depth of ~20 µm can be etched in quartz or Si/SiO$_2$ substrates. A continuous SWNT thin film was transferred onto the substrates over the trenches area (FIG. 24A). Laser patterning was applied to form 10 pixel arrays of SWNT thin films bolometric detectors suspended across the trenches (FIG. 24B). Individual pixels were addressed by a pattern of gold interconnects deposited by e-beam.

Example 19: Improved Performance of SWNT Thin Film Detector after Chemical Functionalization of SC-SWNTs The bolometric response of individual pixels of SWNT thin film detectors was compared before and after chemical functionalization of SC-SWNTs. In both cases SWNT thin film sensitive element was suspended across the etched trench of 100 µm size as shown in FIG. 25A. The bolometric response of the SC-SWNT thin films before chemical functionalization to IR radiation of incident power 4.7 µW in mid-wave infrared (MWIR) spectral range of wavelengths 3-5 μm is presented in FIG. 25B. The response to the same incident radiation power of a similar SWNT bolometric detector after chemical functionalization utilizing diazonium chemistry with the bromophenyl group is shown in FIG. 25C. FIG. 25 shows that after chemical functionalization the amplitude of the photoresponse increased by ~2000 times from ~2.5 μW to 53 mV and signal-to-noise ratio increased by 150 times from 16 to 2400.

Example 20: Comparison of the Performances of SWNT Thin Film Detector with Commercial Pyroelectric Detector The performance of SWNT thin film microbolometer was compared with the performance of a commercial pyroelectric detector DSS-LT020A/BAF2 from HORIBA JOBIN YVON. The specifications of the pyroelectric detector quote a noise equivalent power of NEP <1×10$^{-9}$ W/Hz$^{1/2}$. For this experiment the area of pyroelectric detector was matched to the area of a 100×100 μm$^2$ SWNT-based microbolometer by using a diaphragm to equalize the incident radiation power for the detectors to 4.7 μW in the MWIR spectral range. FIG. 26 shows the results of the test of the pyroelectric detector which give S/N=660.

FIG. 27 shows the response to the same MWIR radiation power of SWNT-based microbolometer prepared from SC-SWNTs after optimized physical processing and diazonium (phenylbromo) functionalization showing S/N=2400, which is more than 3-4 times better than the commercial pyroelectric detector. Thus, under closely matched conditions, the SWNT-based detector disclosed herein matches and even exceeds the performance of a commercial pyroelectric detector.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

REFERENCES

Delamar, M.; Hitmi, R.; Pinson, J.; Saveant, J. M., Covalent Modification of Carbon Surfaces by Grafting of Functionalized Aryl Radicals Produced from Electrochemical Reduction of Diazonium Salts. *J. Am. Chem. Soc.* 1992, 114, 5883-5884.
Liu, Y. C.; Mccreery, R. L., Reactions of Organic Monolayers on Carbon Surfaces Observed with Unenhanced Raman-Spectroscopy. *J. Am. Chem. Soc.* 1995, 117, 11254-11259.
Bahr, J. L.; Yang, J.; Kosynkin, D. V.; Bronikowski, M. J.; Smalley, R. E.; Tour, J. M., Functionalization of Carbon Nanotubes by Electrochemical Reduction of Aryl Diazonium Salts: A Bucky Paper Electrode. *J. Am. Chem. Soc.* 2001, 123, 6536-6542.
Bahr, J. L.; Tour, J. L., Highly Functionalized Carbon Nanotubes Using in Situ Generated Diazonium Compounds. *Chem. Mater.* 2001, 13, 3823-3824.
Bekyarova, E.; Itkis, M. E.; Ramesh, P.; Berger, C.; Sprinkle, M.; de Heer, W. A.; Haddon, R. C., Chemical Modification of Epitaxial Graphene: Spontaneous Grafting of Aryl Groups. *J. Am. Chem. Soc.* 2009, 131, 1336-1337.
Nikitin, A.; Li, X. L.; Zhang, Z. Y.; Ogasawara, H.; Dai, H. J.; Nilsson, A., Hydrogen Storage in Carbon Nanotubes Through the Formation of Stable C—H Bonds. *Nano Lett.* 2008, 8, 162-167.
Guisinger, N. P.; Rutter, G. M.; Crain, J. N.; First, P. N.; Stroscio, J. A., Exposure of Epitaxial Graphene in SiC (0001) to Atomic Hydrogen. *Nano Lett.* 2009, 9, 1462-1466.
Balog, R.; Jorgensen, B.; Wells, J.; Laegsgaard, E.; Hofmann, P.; Besenbacher, F.; Hornekaer, L., Atomic Hydrogen Adsorbate Structures on Graphene. *J. Am. Chem. Soc.* 2009, 131, 8744-8745.
Balog, R.; Jorgensen, B.; Nilsson, L.; Andersen, M.; Rienks, E.; Bianchi, M.; Fanetti, M.; Laegsgaard, E.; Baraldi, A.; Lizzit, S.; Sljivancanin, Z.; Besenbacher, F.; Hammer, B.; Pedersen, T. G.; Hofmann, P.; Hornekaer, L., Bandgap Opening in Graphene Induced by Patterned Hydrogen Adsorption. *Nat. Mater.* 2010, 9, 315-319.
Giesbers, A. J. M.; Uhlirova, K.; Konecny, M.; Burghard, M.; Aarts, J.; Flipse, C. F. J., Interface-Induced Room-Temperature Ferromagnetism in Hydrogenated Epitaxial Graphene. *Phys. Rev. Lett.* 2013, 111, 166101.
Gan, L.; Zhou, J.; Ke, F.; Gu, H.; Li, D.; Hu, Z.; Sun, Q.; Guo, X., Tuning the Properties of Graphene Using a Reversible Gas-Phase Reaction. *NPG Asia Mat.* 2012, 4, e31.

What is claimed is:

1. A focal plane array for an infrared (IR) microbolometric detector, comprising
an infrared-sensitive pixel array comprising of semiconducting single-walled carbon nanotubes (SWNTs) subjected to a physical processing step and a nanotube sidewall chemical functionalization step of covalently bonding an organic functional group to the sidewall, thereby increasing a temperature coefficient of resistance (TCR) for semiconducting SWNTs pixels by from about 1% to about 5% per degree C.

2. The focal plane array of claim 1, wherein the physical processing step comprises two or more of: ultrasonication, shear mixing, and thermal annealing in vacuum.

3. The focal plane array of claim 2, wherein the semiconducting SWNTs sidewall chemical functionalization step comprises one or more of: a diazonium reaction; non-covalent or covalent attachment of one or more functional groups selected from octadecylamine groups, poly(m-aminobenzenesulfonic acid) groups, polyethyleneglycol groups, and amino phenyl functional groups; an organometallic complexation; a Diels-Alder reaction; a free radical reaction; a Birch reaction; a gas phase reaction; a carbene reaction; a nitrene reaction; and doping or compensation for a natural p-doped state of the carbon nanotubes.

4. The focal plane array of claim 3, wherein the diazonium chemistry functionalization step comprises reacting the semiconducting SWNTs provided as a thin film or as a dispersion of semiconducting SWNTs with a diazonium salt.

5. The focal plane array of claim 4, wherein the diazonium salt is selected from the group consisting of bromobenzene diazonium salt, nitrophenyl diazonium salt, and methoxy diazonium salt.

6. The focal plane array of claim 1, including semiconducting SWNTs having a degree of separation from metallic SWNTs in a range of from about 80% to about 100%.

7. The focal plane array of claim 4, wherein the chemical functionalization is conducted on the dispersion of semiconducting SWNTs in organic solvents or water.

8. The focal plane array of claim 7, comprising a carbon nanotube semiconducting SWNT thin film having a pattern of carbon nanotube thin film pixels, wherein the pattern is provided by airbrushing carbon nanotube dispersions in organic solvents over precision shadow masks.

9. The focal plane array of claim 4, wherein the chemical functionalization is conducted on the semiconducting SWNT thin film.

10. The focal plane array of claim 4, wherein the chemical functionalization is conducted on a suspended semiconducting SWNT thin film.

11. The focal plane array of claim 4, wherein the chemical functionalization is conducted on a patterned semiconducting SWNT thin film.

12. The focal plane array of claim 11, wherein the patterned carbon nanotube thin film is provided by removal of selected portions of the semiconducting SWNT thin film by a focused laser beam to provide a pattern of semiconducting SWNT thin film pixels.

13. A focal plane array for an infrared (IR) microbolometer detector, comprising an infrared-sensitive pixel array comprising semiconducting single-walled carbon nanotubes (SWNTs) subjected to a physical processing step and a nanotube sidewall chemical functionalization step of covalently bonding an organic functional group to the sidewall, thereby increasing a temperature coefficient of resistance (TCR) for semiconducting SWNTs pixels by from about 1% to about 5% per degree C.;

further wherein the semiconducting SWNTs are subjected to:
i) ultrasonication;
ii) shear mixing;
iii) the sidewall chemical functionalization step; and
iv) thermal annealing in vacuum.

14. The focal plane array of claim 12, wherein the focused laser beam has a laser emission wavelength selected from the group consisting of: a near-infrared spectral range, a visible spectral range, and an ultra-violet spectral range.

15. The focal plane array of claim 2, wherein the nanotube sidewall chemical functionalization step comprises a gas phase reaction performed in a vacuum, the gas phase reaction generating radical species that attach directly to the semiconducting SWNT sidewall.

* * * * *